(12) United States Patent
Shirai

(10) Patent No.: US 6,492,721 B1
(45) Date of Patent: Dec. 10, 2002

(54) HIGH-VOLTAGE SIGNAL DETECTING CIRCUIT

(75) Inventor: Takayuki Shirai, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/330,080

(22) Filed: Jun. 11, 1999

(30) Foreign Application Priority Data

Jun. 11, 1998 (JP) .......................................... 10-163378

(51) Int. Cl.[7] .............................................. H01L 23/52
(52) U.S. Cl. ...................................... 257/691; 257/355
(58) Field of Search ................................ 257/691, 355, 257/48, 203, 368

(56) References Cited

FOREIGN PATENT DOCUMENTS

| JP | 61-140876 | 6/1986 |
|---|---|---|
| JP | 62-22079 | 1/1987 |
| JP | 62-121374 | 6/1987 |
| JP | 1-253670 | 10/1989 |
| JP | 7-12902 | 1/1995 |
| JP | 7229932 | 8/1995 |
| JP | 875801 | 3/1996 |
| JP | 10106299 | 4/1998 |

*Primary Examiner*—Roy Potter
(74) *Attorney, Agent, or Firm*—Young & Thompson

(57) ABSTRACT

A high-voltage signal detecting circuit for use in a semiconductor memory device includes a signal transfer section having first nMOSFET, pMOSFET, second nMOSFET and third nMOSFET serially connected together in this order from a first input terminal to a ground line. The gates of pMOSFET and second and third nMOSFETs are connected to a second input terminal for receiving the supply source potential. A discharge transistor is connected between the first node which connects the pMOSFET and second nMOSFET together and the ground line, to discharge electric charge from the first node before application of the source potential. The discharge section provides a high-speed start-up of the memory device.

7 Claims, 5 Drawing Sheets

HIGH-VOLTAGE SIGNAL DETECTING CIRCUIT

FIELD OF THE INVENTION

The present invention relates to a high-voltage signal detecting circuit and, more particularly, to a high-voltage signal detecting circuit which is suitable for use in a semiconductor memory device for detecting a mode selection signal.

DESCRIPTION OF THE RELATED ART

In a semiconductor memory device having a plurality of operational modes such as a normal operational mode and a test mode, a high-voltage signal is generally used as a mode selection signal for specifying a mode other than the normal operational mode. The high-voltage signal has a potential higher than the power-source potential used for operating the semiconductor memory device. Thus, the semiconductor memory device has a high-voltage signal detecting circuit for detecting the high-voltage signal.

Referring to FIG. 1, a conventional high-voltage signal detecting circuit includes a signal transfer section including an nMOSFET 43, a pMOSFET 44 and an nMOSFET 45 serially connected in this order from a first input terminal 42 for receiving a high-voltage signal to the ground (GND). The nMOSFET 43 is of a so-called non-doped transistor having a low threshold voltage, and has a gate and a drain connected together to the first input terminal 12. The substrate of pMOSFET 44 is connected to the source thereof. The gates of pMOSFET 44 and nMOSFET 45 are connected to a second input terminal 41 for receiving a power-source potential. The node 49 connecting both the drains of pMOSFET 44 and nMOSFET 45 together is connected to an input of a potential detecting section including a pair of cascaded inverters 46 and 47, the output of which constitutes an output terminal 50.

In the conventional high voltage detecting circuit of FIG. 1, if a high-voltage signal having a higher potential than the power-source potential is supplied to the first input terminal 42, with the second input terminal 41 maintained at the power-source potential, node 49 as well as node 48 connecting the sources of nMOSFET 43 and pMOSFET 44 together rises due to on-state of nMOSFET 44 and pMOSFET 45 in response to the high-voltage signal. Thus, the output of the high-voltage signal detecting circuit rises to a high level.

However, the conventional high-voltage signal detecting circuit has a disadvantage as detailed below. FIG. 2 shows a specific timing chart of the conventional high-voltage signal detecting circuit of FIG. 1, wherein a significant potential which is higher than the ground potential and not higher than the power-source potential is applied to the first input terminal 42 at time instant t1 before the power-source potential is applied to the second input terminal 41 at time instant t2. This may occur when the power switch is turned on to start operation of the semiconductor memory device. In this case, nMOSFET 43 substantially turns on at time instant t1 due to a high level of the drain and gate potential compared to the source potential thereof. Similarly, pMOSFET substantially turns on at time instant t1 due to a low level of the gate potential which is substantially at a ground potential at time instant t1 although the gate potential is in fact at a floating state. Thus, the significant potential penetrates to nodes 48 and 49, the potentials of which rise after time instant t1. The potential at nodes 48 and 49 fall after time instant t2 due to a fixed power-source potential of the second input terminal 41. The potential rise of node 49 is transmitted to the output terminal 50 of the high voltage detecting circuit as a high level.

In the fall of the potential at node 49, nMOSFET 45 discharges electric charge from node 49 to the ground. In general, nMOSFET 45 is designed to have a lower current driveability in view of low penetrating current penetrating therethrough from the first input terminal 42 to the ground. Thus, the output of the high-voltage signal detecting circuit slowly falls down to a low level at time instant t3 after a relatively long time period. This prevents a higher-speed start-up of the semiconductor memory device. It is generally desired that semiconductor devices including a semiconductor memory device have a short start-up time after switch-on of the semiconductor devices. This should be obtained without causing higher power dissipation due to large penetrating current of MOSFETs.

SUMMARY OF THE INVENTION

It is an object of the present invention to provide a high-voltage signal detecting circuit capable of reducing the time period for start-up of a semiconductor memory device without increasing the penetrating current during the normal operational stage of the high-voltage signal detecting circuit.

The present invention provides a high-voltage signal detecting circuit including: a signal transfer section having a first input terminal for receiving an input signal, a second input terminal connected to a first source line for receiving a power source potential, and a first node electrically coupled with the first input terminal and the second input terminal; a potential detecting section for detecting a potential of the first node to output an active signal when the input signal has a higher potential than the power source potential; and a discharge section for discharging electric charge from the first node before the second terminal receives the power source potential.

In accordance with the high-voltage signal detecting circuit of the present invention, the discharge section discharges electric charge from the first node before application of the source potential to the second input terminal. Thus, a quick start-up can be obtained in the semiconductor memory device having the high-voltage signal detecting circuit of the present invention.

The above and other objects, features and advantages of the present invention will be more apparent from the following description, referring to the accompanying drawings.

PREFERRED EMBODIMENTS OF THE INVENTION

Figure 1:
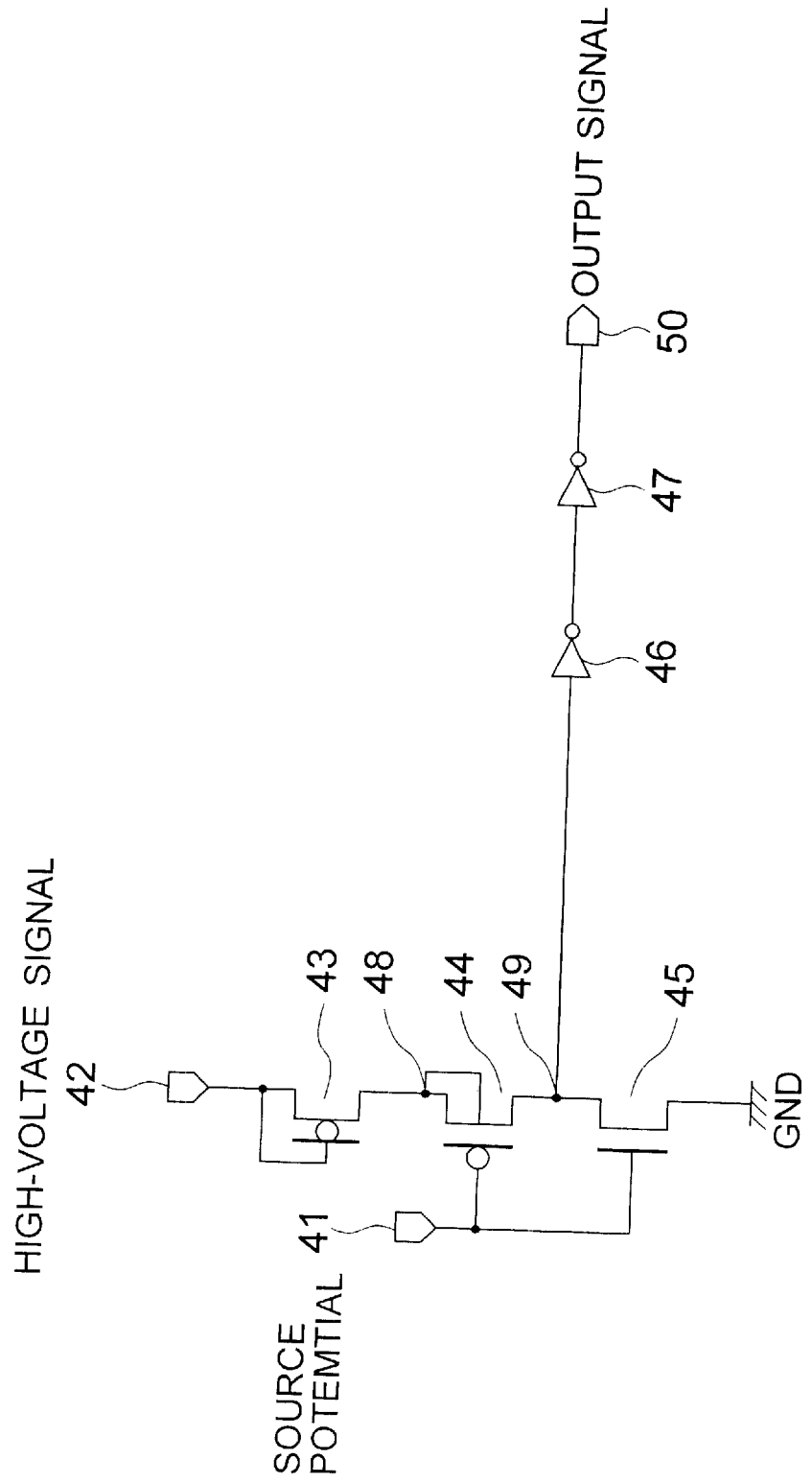
FIG. 1 is block diagram of a conventional high-voltage signal detecting circuit.
Figure 2:
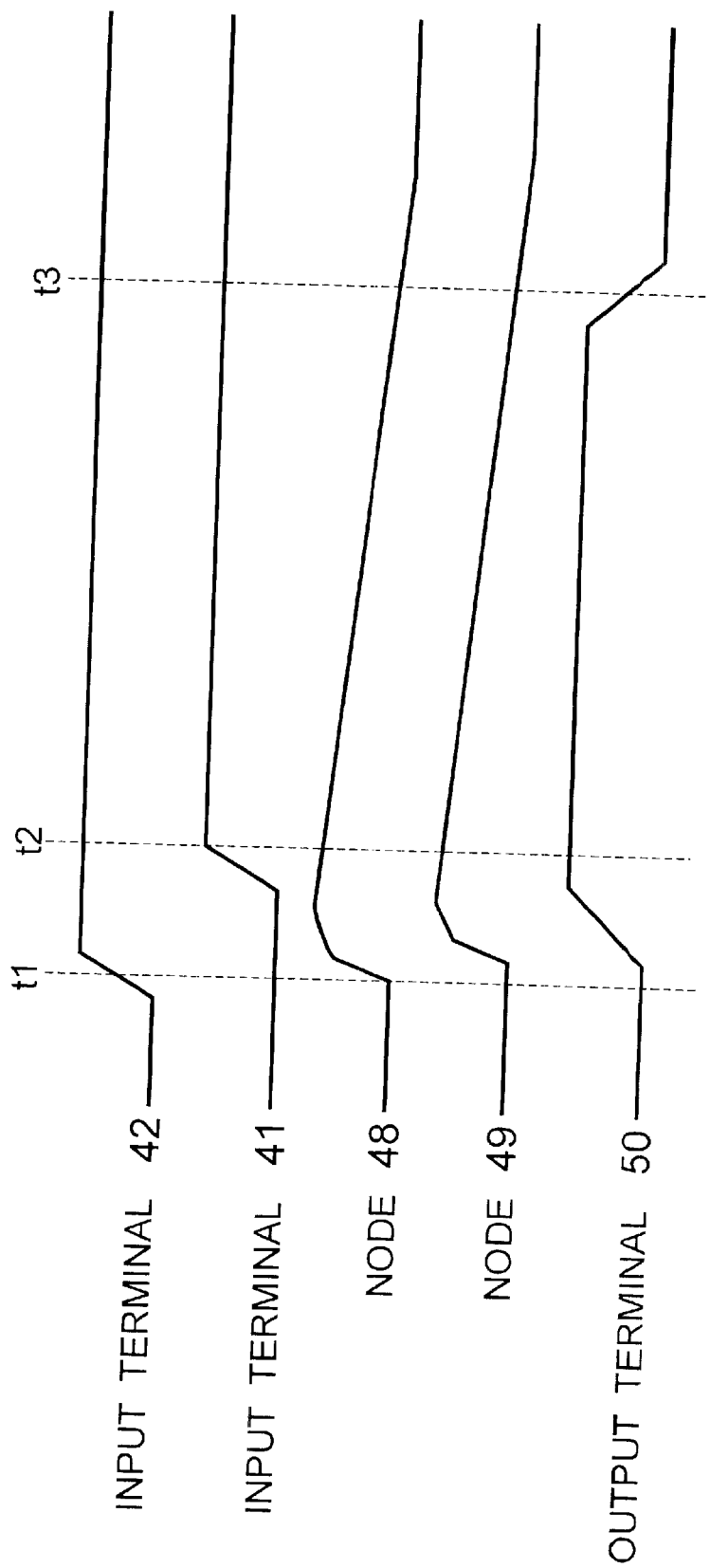
FIG. 2 is a timing chart of a specific case of the high-voltage signal detecting circuit of FIG. 1.

Now, the present invention is more specifically described with reference to accompanying drawings, wherein similar constituent elements are designated by similar reference numerals.

Figure 3:
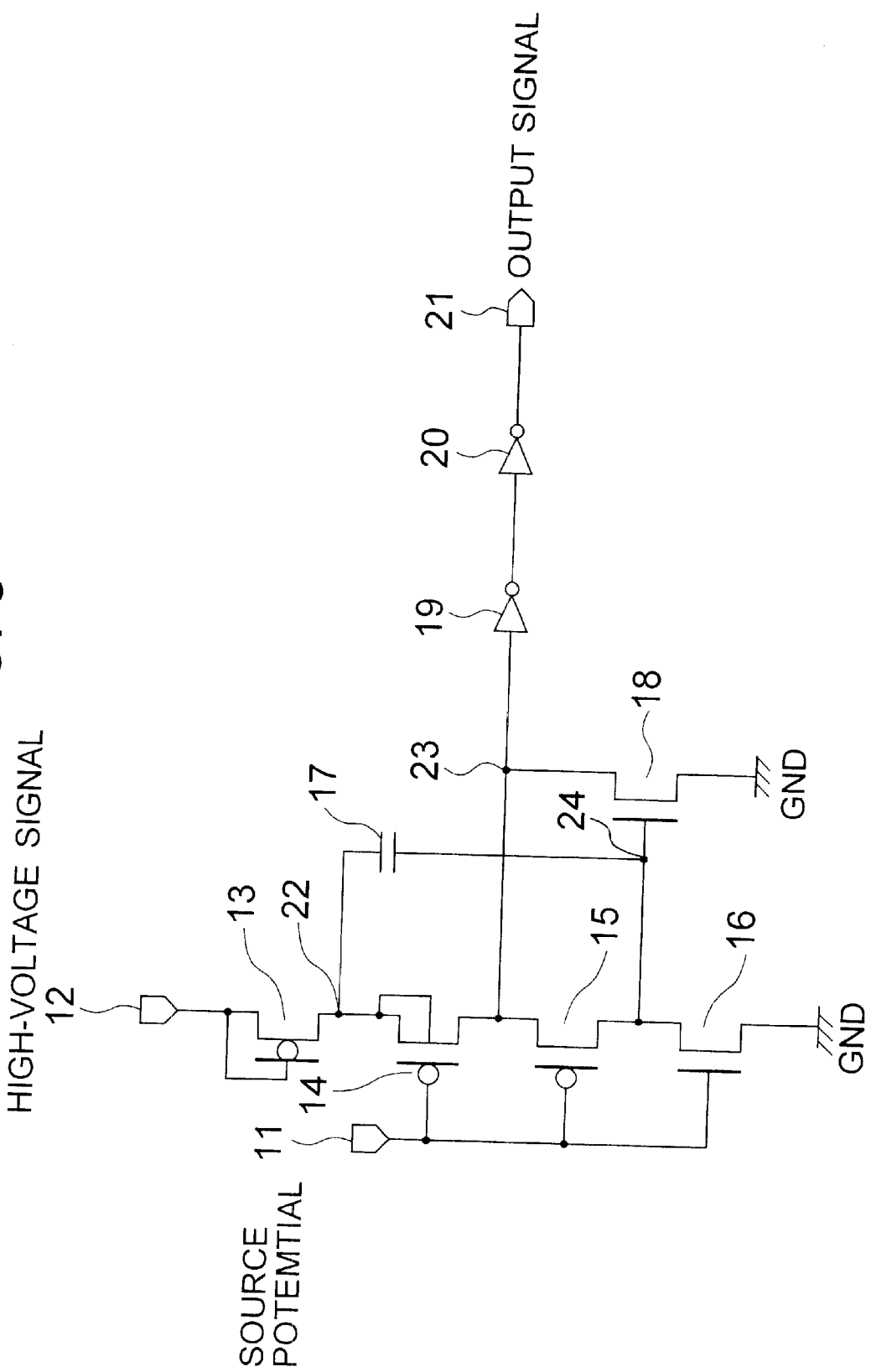
FIG. 3 is a block diagram of a high-voltage signal detecting circuit according to a first embodiment of the present invention.

Referring to FIG. 3, a high-voltage signal detecting circuit according to a first embodiment of the present invention is incorporated in a semiconductor memory device for detecting a high-voltage signal used for designating one of the operational modes of the memory device.

The high-voltage signal detecting circuit includes a signal transfer section having an nMOSFET 13, a pMOSFET 14, an nMOSFET 15 and an nMOSFET 16 serially connected together in this order from a first input terminal 12 for receiving a high-voltage signal to the ground (GND). The nMOSFET 13 is of a so-called non-doped transistor having a low threshold voltage, and has a gate and a drain connected together to the first input terminal 12. The substrate of pMOSFET 14 is connected to the source thereof. The gates of pMOSFET 14, nMOSFET 15 and nMOSFET 16 are connected together to a second input terminal 11 for receiving a power-source potential used for operating the memory device.

A node 23 connecting the drains of pMOSFET 14 and nMOSFET 15 together is connected to an input of a potential detecting section including a pair of cascaded inverters 19 and 20. The output of inverter 20 constitutes an output terminal 21 of the high-voltage signal detecting circuit, which rises to a high level when the high-voltage signal detecting circuit detects a high-voltage signal. The high-voltage signal detecting circuit further includes a nMOSFET 18 as a discharge transistor connected between node 23 and the ground. A capacitor 17 implementing a voltage tranfer member is also connected between a node 22 connecting both the sources of nMOSFET 13 and pMOSFET 14 together and a node 24 connecting the source of nMOSFET 15, the drain of nMOSFET 16 and the gate of nMOSFET 18 together.

In operation, the second input terminal 11 is maintained at the power-source potential to be ready for receiving a high-voltage signal through the first input terminal 12. If a high-voltage signal is not supplied to the first input terminal, that is, the first input terminal 12 is maintained at a potential not higher than the power-source potential, node 23 is maintained at a low level due to off-state of nMOSFET 13 and pMOSFET 14 and on-state of nMOSFETs 15 and 16, whereby output terminal 21 is maintained at a low level or inactive level.

On the other hand, if a high-voltage signal is supplied through the first input terminal 12, node 23 rises to a high level due to on-state of nMOSFET 13 and pMOSFET 14, whereby the output terminal 21 rises to a high level or active level. Thus, the high-voltage signal detecting circuit detects the high-voltage signal supplied to the first input terminal 12.

Figure 4:
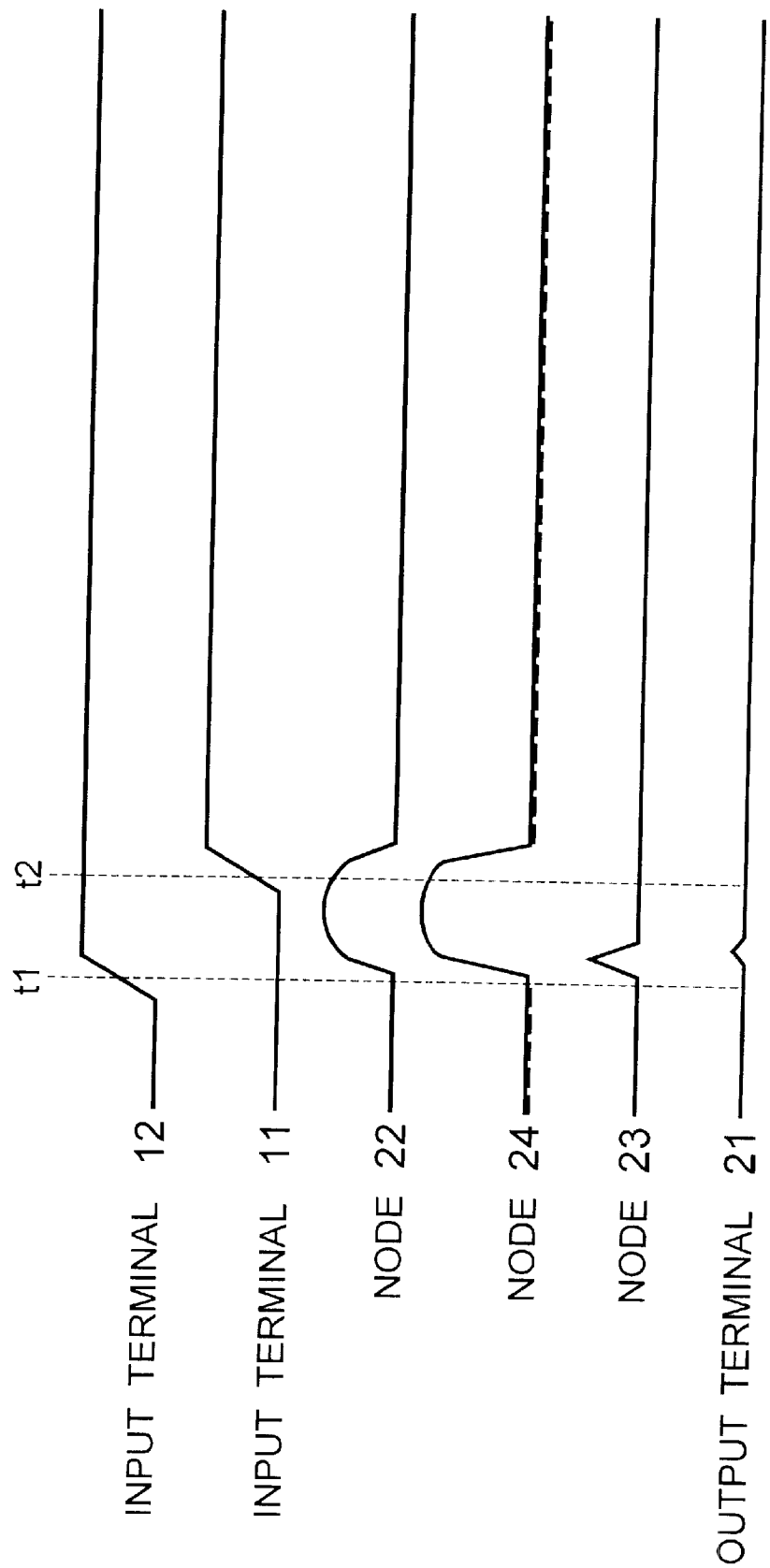
FIG. 4 is a timing chart of a specific case of the high-voltage signal detecting circuit of FIG. 3.

When the power switch is turned on for starting operation of the semiconductor memory device, it may occur that the first input terminal 12 is applied with a significant potential which is higher than the ground potential and not higher than the power-source potential, before the second input terminal 11 is applied with the power-source potential. FIG. 4 is a timing chart showing this situation, wherein the significant potential applied at the first input terminal 12 is exemplified by a potential equal to the power-source potential.

After the significant potential is applied to the first input terminal 12 at time instant t1, the significant potential penetrates through nMOSFET 13 to raise the potential at node 22 due to a substantial on-state of nMOSFET 13. At this instant, the gate of pMOSFET 14 is substantially the ground potential, resulting in that the potential at node 22 also penetrates to node 23 due to substantial on-state of pMOSFET 14. Thus, inverter 19 is almost to detect the rise of the potential at node 23. Also at this instant, however, capacitor 17 transiently transfers the rising potential at node 22 toward node 24 connected to the gate of nMOSFET 18, whereby nMOSFET 18 is turned on. Thus, the electric charge raising the potential at nodes 22 and 23 is discharged through nMOSFET 18 to the ground, which suppresses the potential rise at node 23 and prevents the potential at the input of inverter 19 from rising above the threshold voltage thereof. As shown in FIG. 4, the rise of the potential at node 22 is suppressed below the potential level at node 24.

After the second input terminal 11 is applied with the power-source potential at time instant t2, nMOSFET 12 and pMOSFET 14 are turned off whereas nMOSFETs 15 and 16 are turned on. Thus, the high-voltage signal detecting circuit enters a normal operational stage shortly after time instant t2. The electric charge on node 24 is discharged through nMOSFET 16 to the ground, to thereby turn off nMOSFET 18. Accordingly, the high-voltage signal detecting circuit is free from a large start-up time between turn-on of the power source and a normal operational stage of the high-voltage signal detecting circuit. The nMOSFET 18 is not turned on during the subsequent normal operational stage of the high-voltage signal detecting circuit and does not impose any influence on the operation thereof.

Figure 5:
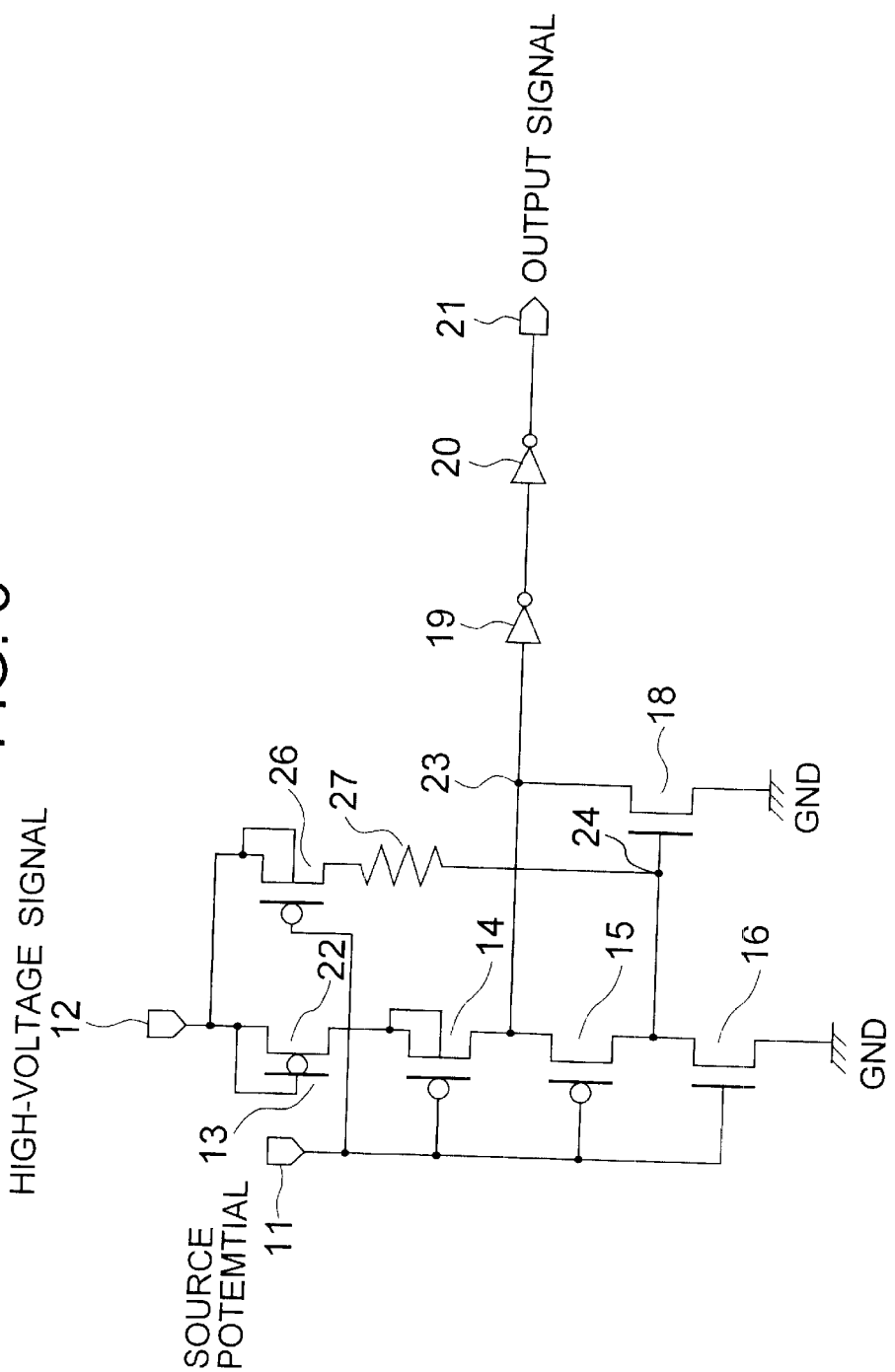
FIG. 5 is a block diagram of a high-voltage signal detecting circuit according to a second embodiment of the present invention.

Referring to FIG. 5, a high-voltage signal detecting circuit according to a second embodiment of the present invention is similar to the first embodiment except that a combination of a pMOSFET 26 and a resistor 27 serially connected together between the first input terminal 12 and node 24 is provided in the present embodiment in place of capacitor 17 in the first embodiment. The gate of pMOSFET 26 is connected to the second input terminal 11.

The high-voltage signal detecting circuit of the present embodiment operates similarly to the first embodiment during a normal operational stage thereof. When the power switch is turned on, a significant potential may be applied to the first input terminal 12 before the second input terminal 11 is applied with the power-source potential. In this case, the significant potential penetrates through nMOSFET 13 and pMOSFET 14 to nodes 22 and 23, similarly to the first embodiment. The significant potential at the first input terminal 12 also turns on pMOSFET 26, which supplies a high gate potential to nMOSFET 18 through resistor 22 to thereby turn on nMOSFET 18. Thus, electric charge is discharged from node 23 through nMOSFET 18 to the ground. Thus, the potential at node 23 does not rise to a high level and does not cause a large start-up time between turn-on of the power source and the subsequent normal operational stage of the high-voltage signal detecting circuit, as in the case of the first embodiment. The second embodiment has an advantage over the first embodiment in the stability of operation.

Since the above embodiments are described only for examples, the present invention is not limited to the above embodiments and various modifications or alterations can be easily made therefrom by those skilled in the art without departing from the scope of the present invention.

What is claimed is:

1. A high-voltage signal detecting circuit comprising: a signal transfer section having a first input terminal for receiving an input signal, a second input terminal connected to a first source line for receiving a power source potential, and a first node electrically coupled with said first input terminal and said second input terminal; a potential detecting section for detecting a potential of said first node to output an active signal when said input signal has a potential higher than said power source potential; and a discharge section for discharging electric charge from said first node before said second input terminal receives said power source potential.

2. A high-voltage signal detecting circuit as defined in claim 1, wherein said discharge section includes a discharge transistor connected between said first node and a second source line, and a voltage transfer member for transferring a voltage of said input signal to a gate of said discharge transistor to turn on said discharge transistor before said second terminal receives said power source potential.

3. The high-voltage signal detecting circuit as defined in claim 2, wherein said voltage transfer member comprises a capacitor.

4. The high-voltage signal detecting circuit as defined in claim 2, wherein said voltage transfer member comprises a pMOSFET connected between said first input terminal and said gate of said discharge transistor.

5. The high-voltage signal detecting circuit as defined in claim 1, wherein said signal transfer section comprises a first nMOSFET, a pMOSFET, a second nMOSFET and a third nMOSFET serially connected together from said first input terminal to a second source line, said first nMOSFET having a gate and a drain connected together, said pMOSFET, said second nMOSFET and said third nMOSFET having respective gates connected to said second input terminal, and wherein a node connecting said pMOSFET and said second nMOSFET implements said first node.

6. The high-voltage signal detecting circuit as defined in claim 5, wherein said discharge section comprises a discharge transistor connected between said first node and a second source line for receiving a ground potential, said discharge transistor having a gate connected to a node connecting said second nMOSFET and said third nMOSFET, and a capacitor connected between a node connecting said first nMOSFET and said pMOSFET and said gate of said discharge transistor.

7. The high-voltage signal detecting circuit as defined in claim 5, wherein said discharge section comprises a discharge transistor connected between said first node and a second source line for receiving a ground potential, said discharge transistor having a gate connected to a node connecting said second nMOSFET and said third nMOSFET, and a MOSFET connected between said first input terminal and said gate of said discharge transistor.

* * * * *